US009800020B2

(12) United States Patent
Telkkälä et al.

(10) Patent No.: US 9,800,020 B2
(45) Date of Patent: Oct. 24, 2017

(54) BROAD AREA LASER INCLUDING ANTI-GUIDING REGIONS FOR HIGHER-ORDER LATERAL MODE SUPPRESSION

(71) Applicant: II-VI Laser Enterprise GmbH, Zürich (CH)

(72) Inventors: Jarkko Telkkälä, Thalwil (CH); Jürgen Müller, Winterthur (CH); Norbert Lichtenstein, Langnau am Albis (CH)

(73) Assignee: II-VI Laser Enterprise GmbH, Zurich (CH)

( * ) Notice: Subject to any disclaimer, the term of this patent is extended or adjusted under 35 U.S.C. 154(b) by 0 days.

(21) Appl. No.: 15/177,525

(22) Filed: Jun. 9, 2016

(65) Prior Publication Data

US 2016/0372892 A1    Dec. 22, 2016

Related U.S. Application Data

(60) Provisional application No. 62/180,766, filed on Jun. 17, 2015.

(51) Int. Cl.

| | |
|---|---|
| *H01S 5/00* | (2006.01) |
| *H01S 5/20* | (2006.01) |
| *H01S 5/22* | (2006.01) |
| *H01S 5/24* | (2006.01) |
| *H01S 5/34* | (2006.01) |

(52) U.S. Cl.
CPC ............ *H01S 5/205* (2013.01); *H01S 5/2022* (2013.01); *H01S 5/2031* (2013.01); *H01S 5/2036* (2013.01); *H01S 5/22* (2013.01); *H01S 5/2202* (2013.01); *H01S 5/24* (2013.01); *H01S 5/34* (2013.01); *H01S 2301/18* (2013.01)

(58) Field of Classification Search
CPC ...... H01S 5/205; H01S 5/2022; H01S 5/2031; H01S 5/2036; H01S 5/22; H01S 5/2202; H01S 5/24; H01S 5/34; H01S 2301/18
See application file for complete search history.

(56) References Cited

U.S. PATENT DOCUMENTS

| | | |
|---|---|---|
| 4,713,820 A | 12/1987 | Morris et al. |
| 4,866,724 A | 9/1989 | Botez et al. |

(Continued)

OTHER PUBLICATIONS

Wenzel, Hans et al., "Suppression of Higher-Order Lateral Modes in Broad-Area Diode Lasers by Resonant Anti-Guiding", IEEE Journal of Quantum Electronics, vol. 49, No. 12, Dec. 2013.

*Primary Examiner* — Armando Rodriguez
(74) *Attorney, Agent, or Firm* — Wendy W. Koba

(57) ABSTRACT

A broad area laser diode is configured to include an anti-guiding layer located outside of the active region of the device. The anti-guiding layer is formed of a high refractive index material that serves to de-couple unwanted, higher-order lateral modes (attributed to thermal lensing problems) from the lower-order mode output beam of output signal from the laser diode. The anti-guiding layer is formed using a single epitaxial growth step either prior to or subsequent to the steps used to grow the epitaxial layers forming the laser diode itself, thus creating a structure that provides suppression of unwanted higher-order modes without requiring a modification of specific process steps used to fabricate the laser diode itself.

14 Claims, 3 Drawing Sheets

(56) References Cited

U.S. PATENT DOCUMENTS

| | | | |
|---|---|---|---|
| 4,965,806 A | 10/1990 | Ashby et al. | |
| 5,272,711 A | 12/1993 | Mawst et al. | |
| 5,974,061 A | 10/1999 | Byren et al. | |
| 6,115,402 A | 9/2000 | Caprara | |
| 6,125,222 A | 9/2000 | Anthon | |
| 6,167,073 A | 12/2000 | Botez et al. | |
| 6,636,539 B2 | 10/2003 | Martinsen | |
| 6,744,790 B1 | 6/2004 | Tilleman et al. | |
| 6,944,192 B2 | 9/2005 | Prassas et al. | |
| 7,378,681 B2 * | 5/2008 | Abraham | G02B 6/122 257/22 |
| 8,027,818 B1 | 9/2011 | Alterman et al. | |
| 8,233,513 B1 | 7/2012 | Schleuning et al. | |
| 8,446,926 B2 | 5/2013 | Schleuning et al. | |
| 8,537,869 B2 | 9/2013 | Crump et al. | |
| 8,619,833 B2 | 12/2013 | Lell et al. | |
| 8,675,705 B2 | 3/2014 | Erbert et al. | |
| 8,798,109 B2 | 8/2014 | Gotz et al. | |
| 8,804,782 B2 | 8/2014 | Schleuning et al. | |
| 8,831,062 B2 | 9/2014 | Pfeiffer et al. | |
| 2011/0243169 A1 | 10/2011 | Lauer et al. | |
| 2012/0287957 A1 * | 11/2012 | Crump | H01S 5/2036 372/45.01 |
| 2013/0294467 A1 | 11/2013 | Moloney et al. | |

* cited by examiner

BROAD AREA LASER INCLUDING ANTI-GUIDING REGIONS FOR HIGHER-ORDER LATERAL MODE SUPPRESSION

CROSS-REFERENCE TO RELATED APPLICATIONS

This application claims the benefit of U.S. Provisional Application Ser. No. 62/180,766, filed Jun. 17, 2015 and herein incorporated by reference.

TECHNICAL FIELD

The present invention relates to a broad area laser diode and, more particularly, to a broad area laser diode including at least one anti-guiding layer disposed outside the active region of the laser diode to de-couple unwanted higher-order lateral modes and minimize lateral divergence in the farfield.

BACKGROUND OF THE INVENTION

In broad area lasers, the lateral divergence of the emitted radiation increases with increasing output power, as a result of the increase in thermal energy within the structure at higher powers. The laser is heated partly by the current flow into the laser, and partly by the re-absorption of the emitted light. Since the semiconductor materials utilized in the laser structure exhibit temperature-dependent refractive indices, a thermally-induced waveguide is formed as the device's operating temperature increases (a significant aspect of high power operation). As a result, lasing of (unwanted) higher-order lateral modes with increasing power is created, causing ever-increasing lateral divergence.

The scale of the refractive index contrast formed by such a thermally-induced waveguide is in the range of about $10^{-4}$ to $10^{-3}$. The increasing lateral divergence associated with this change in refractive index reduces the ability of the output beam to focus within the desired dimensions, limiting its use in applications such as materials processing, for example, that require a high beam quality.

One prior art approach to minimizing problems associated with the thermally-induced waveguide is described in U.S. Pat. No. 8,233,513 entitled "Broad-Area Edge-Emitting Semiconductor Laser with Limited Thermal Contact" and issued to D. Schleuning et al. on Jul. 31, 2012. Here, the broad area laser diode is mounted on a large heat-sink, where the heat-sink is formed to include a pair of parallel grooves, creating a ridge that has a width about equal to the width of the emitter region. The laser diode is mounted so as to contact the ridge portion of the heat-sink, providing a path for the transfer of thermal energy away from the emitter region of the device. The grooves function to confine heat flow to the ridge, thus minimizing thermally-induced refractive index contrast.

Another attempt at overcoming the problems associated with thermally-induced waveguides is based on the incorporation of high refractive index anti-guiding regions within the laser diode structure itself, as described in detail is U.S. Pat. No. 8,537,869 entitled "Broad Area Diode Laser with High Efficiency and Small Far-Field Divergence", issued to P. Crump et al. on Sep. 17, 2013. While able to reduce the unwanted higher-order lateral modes, the inclusion of these anti-guiding regions within the active area of the device requires the modification of conventional process steps associated with the fabrication of laser diodes, adding to the cost and complexity of the final structure.

SUMMARY OF THE INVENTION

The limitations remaining in the prior art are addressed by the present invention, which relates to a broad area laser diode and, more particularly, to a broad area laser diode including at least one anti-waveguiding layer disposed outside the active region of the device and, advantageously, formed by using a single epitaxial step that does not other interfere with the process of fabricating the laser diode itself. The inclusion of the anti-waveguiding layer functions to de-couple the unwanted, higher-order lateral modes and maintain a high beam quality.

In accordance with the present invention, a layer of material having a relatively high refractive index value (hereinafter referred to at times as an "anti-waveguidinglayer") is disposed across an outer surface of a broad area laser diode, at a location removed from the active region of the device. This layer of relatively high refractive index material functions as an "anti-waveguiding" layer, influencing the unwanted higher-order lateral modes to be directed away from the active region of the laser and, therefore, maintain the desired high beam quality. The reduction of these unwanted higher-order lateral modes minimizes the lateral divergence in the output beam, thus improving the beam quality. In contrast to prior art arrangements, the anti-guiding layer utilized in the present invention is fabricated using a single step epitaxial growth process that does not interfere with the conventional processing steps used to create the laser diode itself.

In one exemplary embodiment of the present invention, the high refractive index layer is disposed across a top surface of a highly-doped contact layer of the laser diode (creating a so-called "cap layer"). In this configuration, the cap layer is subjected to an etching process to create a window (trench) for accessing the underlying contact layer. This particular configuration thus results in creating an "inverted ridge" laser structure, with the unwanted lateral modes pulled upward into the high refractive index cap layer and away from the active area of the laser diode, thus minimizing the lateral divergence present in the output beam.

Another embodiment of the present invention utilizes a high refractive index layer disposed between the substrate upon which the laser diode is created and the active layer of the device. In this case, the ballast layer is first epitaxially grown on the top surface of a substrate, and a conventional broad area laser diode structure is thereafter fabricated over the ballast layer (using a conventional process). Here, the broad area laser diode is formed to exhibit a ridge waveguide structure, with the unwanted higher-order modes being drawn downward into the ballast layer and away from the active region.

A particular embodiment of the present invention may be defined as a laser diode formed on a substrate and comprising a quantum well emitter region disposed between an n-type waveguiding layer and a p-type waveguiding layer, with an n-type cladding layer disposed over the n-type waveguiding layer and a p-type cladding layer disposed over the p-type waveguiding layer. The laser diode also includes electrical contacts in the form of a highly-doped contact region disposed over a portion of the p-type cladding layer and a electrical contact region applied to an exposed bottom surface of the (thinned) substrate. The overlapping combination of the electrical contacts with the quantum well emitter region define the "active area" of the laser diode. In accordance with the present invention, suppression of unwanted higher-order lateral modes of the emitted beam is provided by the inclusion of an anti-guiding layer formed in a location outside of the active area of the laser diode, the anti-guiding layer formed of a material with a refractive index sufficient to de-couple unwanted, higher-order lateral modes and direct the unwanted, higher-order lateral modes away from the active area of the laser diode and into the anti-guiding layer.

Other and further aspects and embodiments of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION OF THE INVENTION

The present invention relates to a broad area laser structure that overcomes problems associated with thermal lensing (i.e., the presence of a thermally-induced waveguide) and provides a high power, broad area laser with fewer supported laser modes and, therefore, a smaller lateral farfield than various prior art configurations. In accordance with the present invention, an anti-guiding layer of a material with a refractive index higher than that associated with desired mode is formed outside of the primary waveguide of the laser structure. The presence of this high refractive index anti-guiding layer, as explained below, optically "pulls" the undesired higher-order lateral modes out of the active region of the laser and into a region where they can "leak" out of the device and no longer impede its performance.

Figure 1:
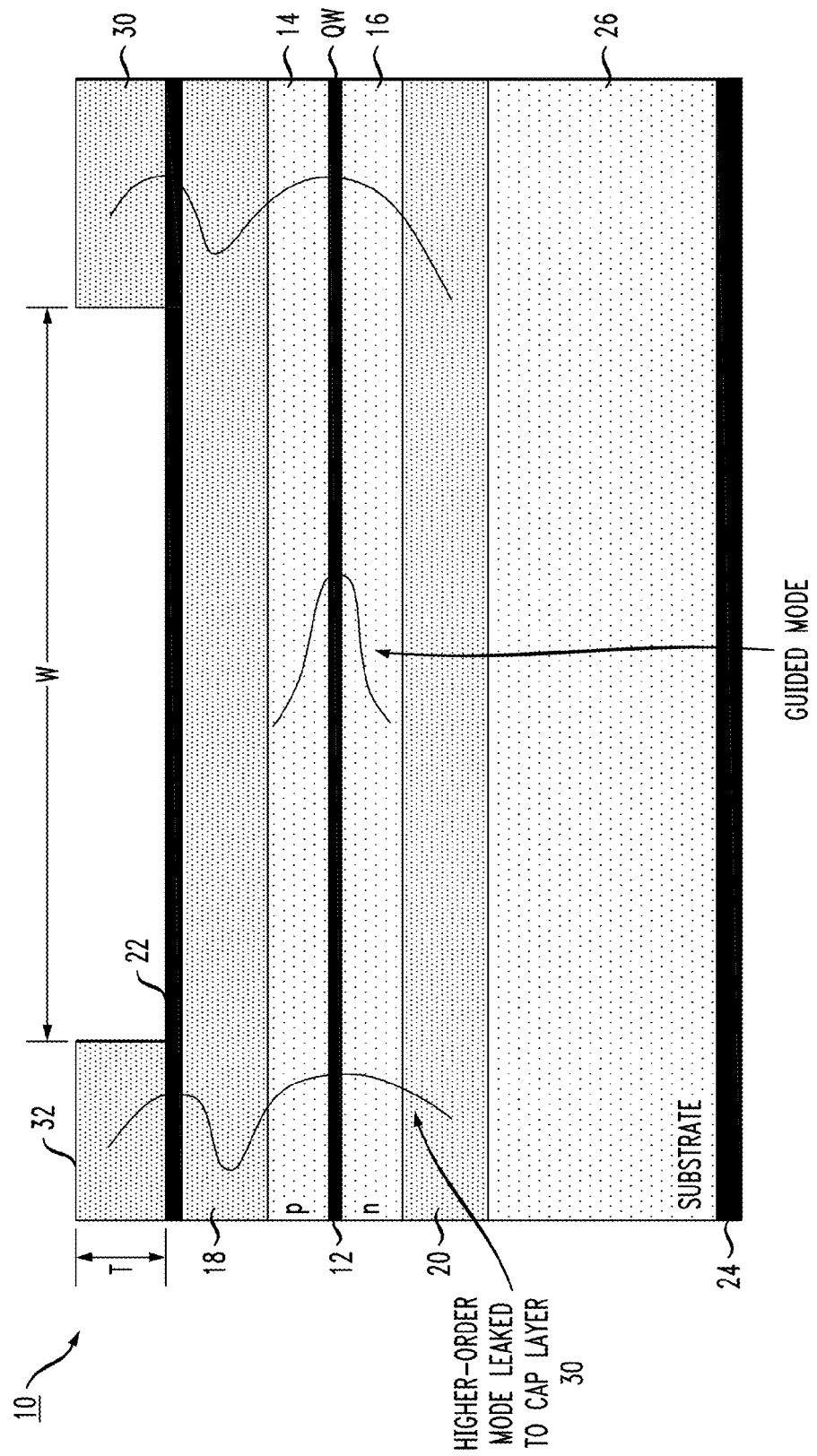
FIG. 1 is a cut-away view of an exemplary embodiment of the present invention, in this case including an anti-guiding layer formed over a top (highly-doped) contact layer of the laser diode, and formed to include a trench so as to create an inverted ridge structure

FIG. 1 illustrates the principles of the present invention, in this case based upon the use of an inverted ridge broad area laser design. A broad area laser 10 is shown as comprising a (quantum well) emitter region 12 disposed between a p-type waveguiding layer 14 and an n-type waveguiding layer 16. A p-type cladding layer 18 is disposed over p-type waveguiding layer 14 and an n-type cladding layer 20 is disposed under n-type waveguiding layer 16. Electrical contact to energize laser 10 is provided by a first electrical contact layer 22 disposed over p-type cladding layer 18 and a second electrical contact layer 24 disposed across an exposed surface of a substrate 26 upon which the laser structure is formed. First electrical contact layer 22 typically comprises a highly-doped layer of semiconductor material and second electrical contact layer 24 typically comprises a multi-layer stack of a suitable metal. The overlap between first electrical contact layer 22, emitter region 12 and second electrical contact layer 24 defines the "active area" (or "active region") of laser 10.

In accordance with an exemplary embodiment of present invention as depicted in FIG. 1, a layer 30 of high refractive index material is disposed over first (highly-doped) contact layer 22 and processed to create regions outside of the active area of laser (layer 30 referred to at times hereinafter as a "cap layer"). Indeed, in a preferred method of fabricating the structure shown in FIG. 1, a conformal layer of high refractive index material is disposed to cover electrical contact layer 22. Subsequent to this step, an opening is created (i.e., etched) in cap layer 30, exposing the portion of electrical contact layer 22 used in defining the active area of laser 10. In many applications, the width W of the active area is an important design parameter and, in this case, is defined by the width of the trench opened in cap layer 30. For broad area lasers, this width W is typically on the order of tens to hundreds of microns, where the broad width is a significant contributing factor to the thermal lensing problem.

In comparison to a conventional prior art ridge design structure, the configuration as shown in FIG. 1 creates an inverted ridge geometry (that is, the positioning of first electrical contact layer 22 below a top surface 32 of cap layer 30). As mentioned above, anti-guiding cap layer 30 is formed of a material exhibiting a relatively high refractive index (some examples include GaAs, AlGaAs, InGaAs, and GaInP—other materials may be used as well). In a preferred fabrication technique, anti-guiding cap layer 30 is grown on top of first, highly-doped, electrical contact layer 22 in a single epitaxial growth step. Once grown, cap layer 30 is then etched to expose a defined portion of first electrical contact layer 22 associated with the desired guided mode area of laser structure 10, forming an inverted ridge design as shown. The ability to form an anti-waveguiding layer in a single epitaxial growth step, without interfering with the conventional process steps in a laser fabrication process, is considered to be a significant advantage of the present invention over the prior art.

Also shown in FIG. 1 are the mode profiles associated with this structure. In particular, the desired guided mode is shown as propagating along the waveguiding structure formed by the combination of emitter region 12 with waveguiding layers 14 and 16. In accordance with the present invention, the presence of high refractive index anti-guiding layer 30 contorts the profile of the higher-order lateral modes in a manner such that these lateral modes are "pulled" upward toward the high refractive index regions, and away from the waveguide of the structure. These higher-order lateral modes are considered to leak into anti-guiding cap layer 30.

Figure 2:
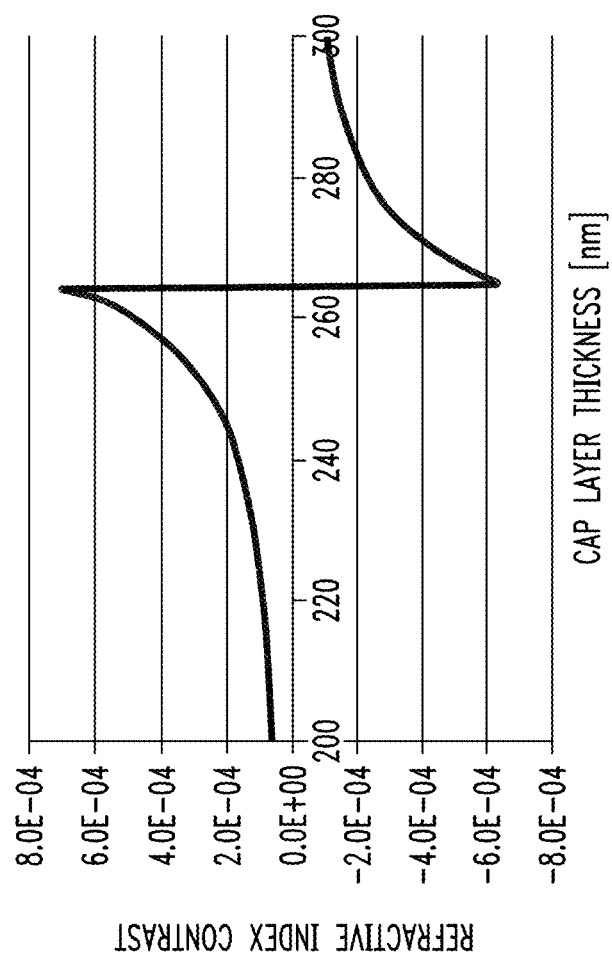
FIG. 2 is graph of the refractive index contrast of the inventive laser structure as a function of the thickness of the anti-guiding layer.

The loss contribution of cap layer 30 may be further increased by implementing this layer as an "absorbing" quantum well structure (e.g., InGaAs), with a smaller bandgap than a conventional emitter region, or having the outside region heavily doped. Indeed, the effect may be enhanced by controlling the selection of the thickness T of anti-guiding cap layer 30 so that a resonance is formed between the waveguide and the anti-guiding cap layer. FIG. 2 illustrates this point for a specific GaAs-capped AlGaAs/InGaAs QW laser structure.

Figure 3:
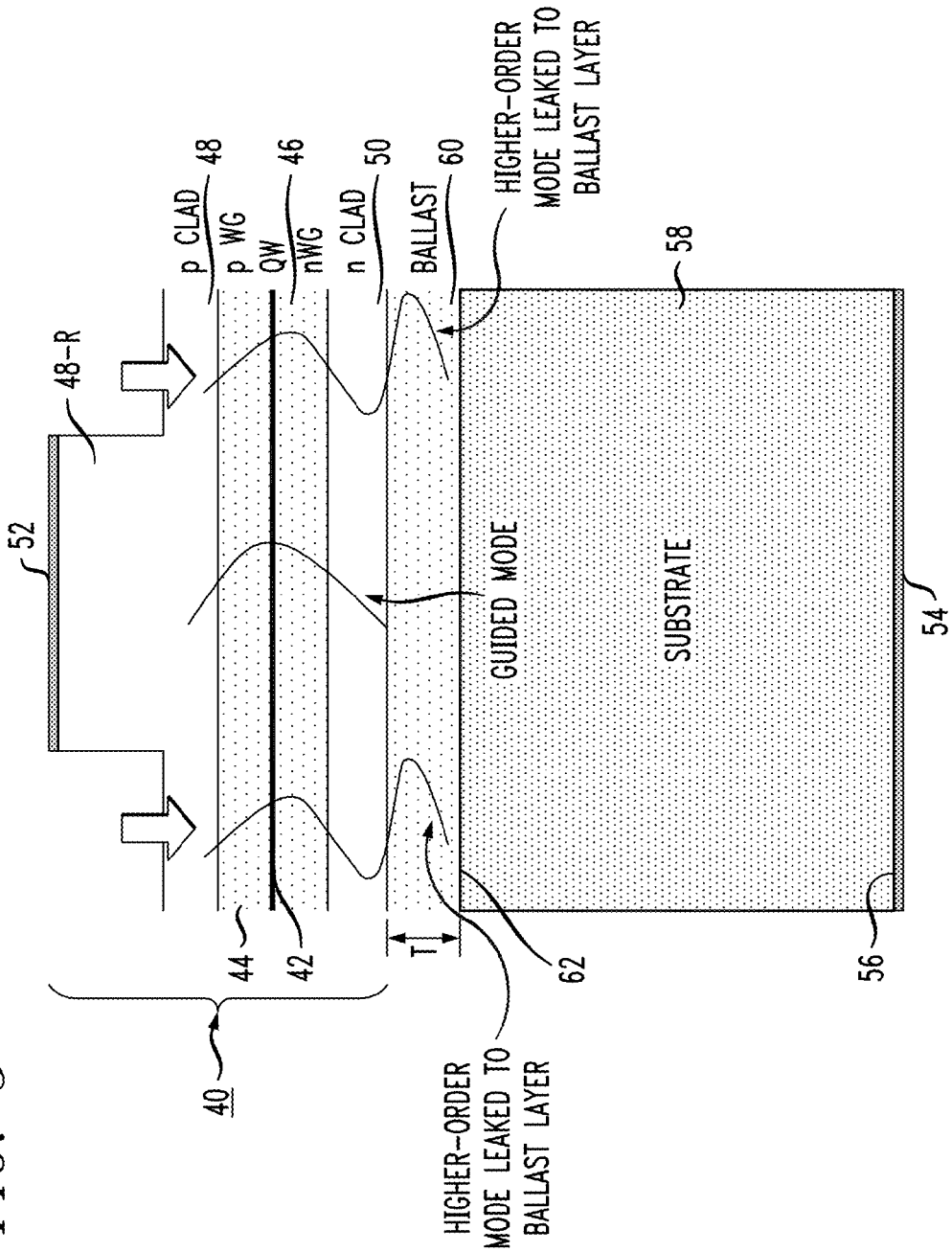
FIG. 3 is a cut-away view of another embodiment of the present invention, in this case taking the form of a conventional ridge waveguide structure in a broad area laser diode, with an anti-guiding layer disposed as a "ballast" layer between the substrate and the lower contact layer of the device.

An alternative embodiment of the present invention is shown in FIG. 3. A broad area laser diode 40 is shown as including a QW emitter region 42, disposed between a p-type waveguiding layer 44 and an n-type waveguiding layer 46. Laser diode 40 is shown as comprising a conventional ridge structure, in this case by configuring a p-type cladding layer 48 to exhibit a ridge geometry (shown as portion 48-R of cladding layer 48). The ridge structure is utilized to assist in confining the propagating mode within the desired active area of the device. An n-type cladding layer 50 is formed as shown below n-type waveguiding layer 46.

A first electrical contact layer 52 is disposed over ridge portion 48-R of p-type cladding layer 48. As with the configuration of FIG. 1, first electrical contact layer typically comprises a layer of highly-doped semiconductor material. A second electrical contact layer 54 is disposed to cover an exposed major surface 56 of a substrate 58 (typically formed as a metallic coating on an exposed surface subsequent to a polishing/grinding operation used to reduce the substrate thickness in the final device structure). In accordance with this embodiment of the present invention a high refractive index anti-guiding layer 60 is disposed as an interface between a top surface 62 of substrate 58 and n-type cladding layer 50.

In the fabrication of this exemplary embodiment, anti-guiding layer 60 is first formed over surface 62 of substrate 58, with the conventional laser diode structure then formed over anti-guiding layer 60. Preferably, anti-guiding layer 60 is grown on top surface 62 in a single step epitaxial growth process, with the epitaxial process continuing until a desired thickness T of layer 60 is obtained. Once the desired thickness of anti-guiding layer 60 is reached, a series of conventional processing steps is used to fabricate laser diode 40 over the surface of layer 60. Indeed, in this particular embodiment of the present invention, the subsequent fabrication steps associated with laser diode 40 may be performed in situ, continuing with the growth of n-type cladding layer 50 directly over the surface of anti-guiding layer 60. Again, in accordance with the present invention, it is clear that an advantage of the present invention is the ability to incorporate an anti-guiding layer in a broad area laser diode structure without modifying the steps used to form the laser diode itself.

In accordance with this embodiment of the present invention, ballast layer 60 (in combination with ridge structure 48-R) is configured to "pull" the undesirable higher-order lateral modes out of the waveguiding area, directing these modes out of the guided mode region and thus maintain only the desired lower-order modes within the active region of the device. FIG. 3 shows the distortion in modes attributed to the inclusion of ballast layer 60 in the structure.

Similar to the configuration of FIG. 1, the choice of high refractive index material and thickness of ballast layer 60 control the degree of anti-waveguiding of the unwanted higher-order lateral modes that is achieved.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims.

What is claimed is:

1. A laser diode formed on a substrate and comprising
a quantum well emitter region disposed between an n-type waveguiding layer and a p-type waveguiding layer;
an n-type cladding layer disposed over the n-type waveguiding layer and a p-type cladding layer disposed over the p-type waveguiding layer;
a first electrical contact region disposed over a portion of the p-type cladding layer and a second electrical contact region disposed beneath a portion of the substrate, an overlapping combination of the first and second electrical contact regions with the quantum well emitter region defining an active area of the laser diode; and
an anti-guiding layer formed in a location above or below the active area of the laser diode, the anti-guiding layer formed of a material with a refractive index sufficient to de-couple unwanted, higher-order lateral modes and direct the unwanted, higher-order lateral modes out of the active area of the laser diode and into the anti-guiding layer.

2. The laser diode as defined in claim 1 wherein
the anti-guiding layer is disposed above the first electrical contact region and configured to include a trench opening exposing a portion of the first electrical contact region, a defined width of the trench opening defining a width of the active area of the laser diode, the laser diode comprising an inverted ridge configuration.

3. The laser diode as defined in claim 2 wherein the first electrical contact region comprises a layer of highly-doped semiconductor material and the anti-guiding layer comprises an epitaxial layer grown on an exposed surface of the layer of highly-doped semiconductor material of the first electrical contact region, the epitaxially grown layer thereafter patterned and etched to form the trench opening.

4. The laser diode as defined in claim 1 wherein
the laser diode comprises a ridge structure laser diode and the anti-guiding layer is disposed below the active area of the laser diode, between the substrate and the n-type cladding layer.

5. The laser diode as defined in claim 4 wherein the anti-guiding layer comprises an epitaxial layer grown on an exposed surface of the substrate, with remaining layers of the laser diode formed over the epitaxially-grown anti-guiding layer.

6. The laser diode as defined in claim 1 wherein the anti-guiding layer exhibits an index of refraction greater than the quantum well emitter region, and the cladding layers.

7. The laser diode as defined in claim 6 wherein the anti-guiding layer comprises a material selected from the group consisting of: GaAs, AlGaAs, InGaAs, and GaInP.

8. The laser diode as defined in claim 1 wherein the first electrical contact region comprises a layer of highly-doped semiconductor material.

9. The laser diode as defined in claim 1 wherein the second electrical contact region comprises at least one metal layer formed to coat a portion of the substrate bottom surface.

10. A broad area laser diode formed on a substrate and comprising
a quantum well emitter region disposed between an n-type waveguiding layer and a p-type waveguiding layer;
an n-type cladding layer disposed over the n-type waveguiding layer and a p-type cladding layer disposed over the p-type waveguiding layer,
a first electrical contact region disposed over the p-type cladding layer and having a width W associated with a width of an emission region of the laser diode;
a second electrical contact region disposed beneath an exposed substrate surface, an overlapping combination of the first and second electrical contact regions with the quantum well emitter region defining an active region of the broad area laser diode, with a width of the active region associated with the created width W of the first electrical contact region; and
an anti-guiding layer formed in a location above or below the active region of the laser diode, the anti-guiding layer formed of a material with a refractive index sufficient to de-couple unwanted, higher-order lateral modes and direct the unwanted, higher-order lateral modes away from the active region of the laser diode so as to minimize the lateral divergence of a beam emitted by the broad area laser diode.

11. The broad area laser diode as defined in claim 10 wherein
the anti-guiding layer is disposed over the first electrical contact region and configured to include a trench opening exposing a portion of the first electrical contact defining the emission region of the laser diode, the laser diode comprising an inverted ridge configuration.

12. The broad area laser diode as defined in claim 11 wherein the first electrical contact region comprises a layer of highly-doped semiconductor material and the anti-guiding layer comprises an epitaxial layer grown on an exposed surface of the layer of highly-doped semiconductor material, the epitaxially grown layer thereafter patterned and etched to form the trench opening.

13. The broad area laser diode as defined in claim 10 wherein
the laser diode comprises a ridge structure laser diode, with the width of the ridge associated with the width of a beam emitted by the laser diode, and the anti-guiding layer is disposed between the substrate and the n-type cladding layer.

14. The broad area laser diode as defined in claim 13 wherein the anti-guiding layer comprises an epitaxial layer grown on an exposed surface of the substrate, with remaining layers of the laser diode grown epitaxially in a single step together with the anti-guiding layer.

* * * * *